United States Patent
Huang et al.

(10) Patent No.: US 10,868,060 B2
(45) Date of Patent: Dec. 15, 2020

(54) PHOTOELECTRIC DETECTION SUBSTRATE, METHOD FOR FABRICATING THE SAME, AND PHOTOELECTRIC DETECTION DEVICE

(71) Applicant: BOE TECHNOLOGY GROUP CO., LTD., Beijing (CN)

(72) Inventors: Rui Huang, Beijing (CN); Xin Yang, Beijing (CN); Tianmin Zhou, Beijing (CN); Huili Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/542,441

(22) Filed: Aug. 16, 2019

(65) Prior Publication Data

US 2020/0058691 A1 Feb. 20, 2020

(30) Foreign Application Priority Data

Aug. 16, 2018 (CN) .......................... 2018 1 0931892

(51) Int. Cl.
*H01L 27/146* (2006.01)

(52) U.S. Cl.
CPC .. *H01L 27/14616* (2013.01); *H01L 27/14603* (2013.01); *H01L 27/14663* (2013.01); *H01L 27/14692* (2013.01)

(58) Field of Classification Search
CPC ............................................... H01L 27/14616
See application file for complete search history.

(56) References Cited

U.S. PATENT DOCUMENTS

| 9,941,324 | B2* | 4/2018 | Nara | ................. | H01L 27/14689 |
| 10,347,673 | B2* | 7/2019 | Otake | ............... | H01L 27/14616 |
| 10,559,613 | B2* | 2/2020 | Kim | ....................... | H04N 5/378 |

(Continued)

FOREIGN PATENT DOCUMENTS

| CN | 101388405 A | 3/2009 |
| CN | 102751302 A | 10/2012 |

(Continued)

OTHER PUBLICATIONS

First Office Action and English language translation, CN Application No. 201810931892.5, dated Apr. 17, 2020, 23 pp.

*Primary Examiner* — William Coleman
(74) *Attorney, Agent, or Firm* — Myers Bigel, P.A.

(57) ABSTRACT

A photoelectric detection substrate, a method for fabricating the same, and a photoelectric detection device are disclosed. The photoelectric detection substrate includes a thin film transistor and a photodiode coplanar with the thin film transistor. The thin film transistor has a vertical channel structure and includes a gate electrode, an active layer, a first electrode and a second electrode. The photodiode includes a first doped layer, an absorption layer and a second doped layer disposed in this order. The active layer and the absorption layer are disposed in a same layer and formed by a same patterning process. By forming a photodiode coplanar with a thin film transistor of a vertical channel structure, the overall thickness of the photoelectric detection substrate is effectively reduced, deformation of the substrate caused by stress is reduced, and damage caused by deformation of the substrate is avoided, and thereby the yield is improved.

19 Claims, 4 Drawing Sheets

(56) References Cited

U.S. PATENT DOCUMENTS

| | | |
|---|---|---|
| 2009/0072247 A1 | 3/2009 | Choi |
| 2017/0236855 A1* | 8/2017 | Tomiyasu ............ H01L 27/1225 378/91 |
| 2017/0250214 A1* | 8/2017 | Sekine .............. H01L 27/14689 |
| 2019/0074321 A1* | 3/2019 | Na .................... H01L 27/14663 |

FOREIGN PATENT DOCUMENTS

| | | |
|---|---|---|
| CN | 106960881 A | 7/2017 |
| KR | 10-2005-0001936 A | 1/2005 |

* cited by examiner

PHOTOELECTRIC DETECTION SUBSTRATE, METHOD FOR FABRICATING THE SAME, AND PHOTOELECTRIC DETECTION DEVICE

RELATED APPLICATION

The present application claims the benefit of Chinese Patent Application No. 201810931892.5, filed on Aug. 16, 2018, the entire disclosure of which is incorporated herein by reference.

TECHNICAL FIELD

The present disclosure relates to the field of detection technologies, and in particular to a photoelectric detection substrate, a method for fabricating the same, and a photoelectric detection device.

BACKGROUND

Photoelectric detection is widely used in medical, safety, non-destructive testing and other fields, and plays an increasingly important role in the national economy and the people's livelihood. For example, the recent emergence of X-ray Digital Radiography technology has been widely used in medical image detection, industrial production safety testing, astronomy detection, high-energy ion detection, environmental safety detection and other fields. The X-ray Digital Radiography technology may be divided into direct conversion type (Direct DR) and indirect conversion type (Indirect DR). The indirect conversion type X-ray Digital Radiography technology has been widely studied, since it has the advantages of mature development, relatively low cost, and good device stability.

SUMMARY

Embodiments of the present disclosure provide a photoelectric detection substrate comprising: a thin film transistor, and a photodiode which is coplanar with the thin film transistor, wherein the thin film transistor has a vertical channel structure and comprises a gate electrode, an active layer, a first electrode and a second electrode, and the photodiode comprises a first doped layer, an absorption layer and a second doped layer disposed in this order, the active layer and the absorption layer being disposed in a same layer and formed by a same patterning process.

In some embodiments, the photoelectric detection substrate further comprises a base, wherein the photodiode further comprises a lower electrode under the first doped layer, and the first electrode and the lower electrode are disposed on the base in a same layer and formed by a same patterning process.

In some embodiments, the thin film transistor further comprises a first contact layer between the base and the active layer for electrically connecting the first electrode, the active layer and the lower electrode.

In some embodiments, the thin film transistor further comprises a second contact layer between the active layer and the second electrode, and the second contact layer and the second doped layer are disposed in a same layer and formed by a same patterning process.

In some embodiments, the photodiode further comprises an upper electrode on the second doped layer and an electrode lead connected to the upper electrode, and the electrode lead and the second electrode are disposed in a same layer and formed by a same patterning process.

In some embodiments, the photoelectric detection substrate further comprises a first insulating layer between the first electrode and the active layer, for insulating between the first electrode and the active layer.

In some embodiments, the photoelectric detection substrate further comprises a second insulating layer between the gate electrode and the active layer, for insulating between the gate electrode and the active layer.

In some embodiments, the photoelectric detection substrate further comprises a third insulating layer between the gate electrode and the second electrode, for insulating between the gate electrode and the second electrode.

In some embodiments, the photoelectric detection substrate further comprises a fourth insulating layer on the second electrode for planarizing an upper surface of the photoelectric detection substrate.

In some embodiments, an orthographic projection of the upper electrode on the base is smaller than an orthographic projection of the absorption layer on the base, and the orthographic projection of the upper electrode on the base is within the range of the orthographic projection of the absorption layer on the base.

The embodiments of the present disclosure also provide a photoelectric detection device comprising the photoelectric detection substrate mentioned above.

The embodiments of the present disclosure also provide a method for fabricating a photoelectric detection substrate comprising a thin film transistor and a photodiode which is coplanar with the thin film transistor, comprising:

forming a first contact layer and a first electrode of the thin film transistor and a lower electrode and a first doped layer of the photodiode on the base;

forming an active layer and a second contact layer of the thin film transistor and an absorption layer, a second doped layer and an upper electrode of the photodiode, the active layer and the absorption layer being disposed in a same layer and formed by a same patterning process, and the active layer being connected to the first contact layer through a first via;

forming a gate electrode and a second electrode of the thin film transistor and an electrode lead of the photodiode, and the second electrode being connected to the second contact layer through a second via.

In some embodiments, the first electrode and the lower electrode are disposed in a same layer and formed by a same patterning process.

In some embodiments, the second contact layer and the second doped layer are disposed in a same layer and formed by a same patterning process.

In some embodiments, the second electrode and the electrode lead are disposed in a same layer and formed by a same patterning process.

In some embodiments, the step of forming a first contact layer and a first electrode of the thin film transistor and a lower electrode and a first doped layer of the photodiode on the base comprises:

forming a first contact layer on the base;

forming a first electrode and a lower electrode, wherein the respective ends of the first electrode and the lower electrode which are adjacent to each other are connected to the first contact layer respectively;

forming a first insulating layer covering the first electrode and the lower electrode, with a third via exposing the lower electrode being formed on the first insulating layer;

forming a first doped layer on the first insulating layer, the first doped layer being connected to the lower electrode through the third via.

In some embodiments, the step of forming an active layer and a second contact layer of the thin film transistor and an absorption layer, a second doped layer and an upper electrode of the photodiode comprises:

forming the first via exposing the first contact layer on the first insulating layer;

forming the active layer and the second contact layer of the thin film transistor and the absorption layer, the second doped layer and the upper electrode of the photodiode by a patterning process, wherein the active layer is connected with the first contact layer through the first via, the second contact layer is on the active layer, the absorption layer is on the first doped layer, the second doped layer is on the absorption layer, and the upper electrode is on the second doped layer.

In some embodiments, the step of forming the active layer and the second contact layer of the thin film transistor and the absorption layer, the second doped layer and the upper electrode of the photodiode by a patterning process comprises:

depositing an intrinsic layer film, a second doped layer film, and a transparent conductive film in this order;

patterning the intrinsic layer film, the second doped layer film, and the transparent conductive film by a first patterning process to form the active layer and the second contact layer of the thin film transistor, as well as the absorption layer and the second doped layer of the photodiode, wherein the second contact layer and the second doped layer are covered with the transparent conductive film;

patterning the transparent conductive film covering the second contact layer and the second doped layer by a second patterning process, removing the transparent conductive film on the second contact layer, so that the transparent conductive film on the second doped layer is inwardly retracted, and the upper electrode is formed on the second doped layer.

In some embodiments, the step of forming a gate electrode and a second electrode of the thin film transistor and an electrode lead of the photodiode comprises:

depositing an insulating layer film and a metal film in this order, forming a second insulating layer and a gate electrode by a patterning process, wherein the gate electrode is at sidewalls of the active layer;

forming a third insulating layer covering the gate electrode, with a second via exposing the second contact layer and a fourth via exposing the upper electrode being formed on the third insulating layer;

forming a second electrode and an electrode lead on the third insulating layer, wherein the second electrode is connected to the second contact layer through the second via, and the electrode lead is connected to the upper electrode through the fourth via.

Of course, implementing any of the products or methods of the present disclosure does not necessarily require all of the advantages described above to be achieved at the same time. Other features and advantages of the present disclosure will be illustrated in the embodiments of the following description, and partially become apparent from the embodiments of the description, or be learned by practice of the present disclosure. The objectives and other advantages of the embodiments of the present disclosure can be realized and obtained by the structure particularly pointed out in the description and claims as well as the drawings.

BRIEF DESCRIPTION OF THE DRAWINGS

The drawings are used to provide a further understanding of the technical solutions of the present disclosure, and constitute a part of the specification. The drawings, along with the embodiments of the present application, are used to explain the technical solutions of the present disclosure, and do not constitute a limitation of the technical solutions of the present disclosure. The shapes and sizes of the various components in the drawings do not reflect true scale, and are merely intended to illustrate the present disclosure.

DETAILED DESCRIPTION OF EMBODIMENTS

Figure 1:
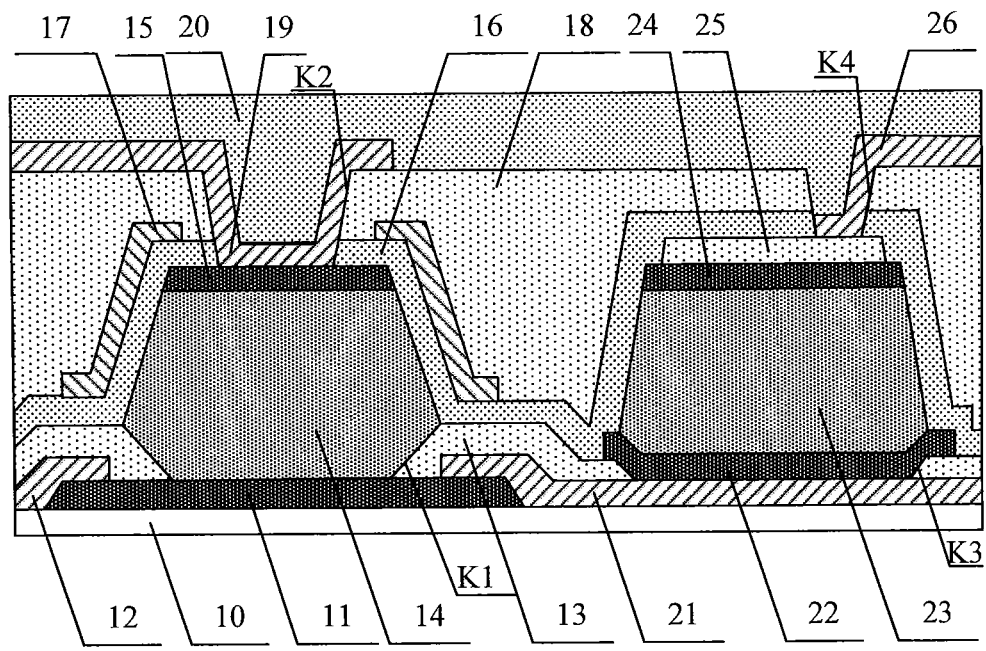
FIG. 1 is a schematic structural view of a photoelectric detection substrate according to an embodiment of the present disclosure.

Specific embodiments of the present disclosure are further described in detail below with reference to the accompanying drawings and embodiments. The following embodiments are intended to illustrate the disclosure, but are not intended to limit the scope of the disclosure. It should be noted that, in the case where there is no conflict, the embodiments in the present application and the features in the embodiments may be arbitrarily combined with each other.

The main structure of the indirect conversion type X-ray Digital Radiography device comprises a photoelectric detection substrate and a scintillation layer, and the photoelectric detection substrate comprises a thin film transistor (TFT) and a photodiode (PD). Under the illumination of X-rays, the scintillation layer (with the phosphor layer) converts the X-ray photons into visible light, the PD converts the visible light into an electrical signal, and the TFT reads the electrical signal and outputs the electrical signal to obtain a display image.

At present, the existing photoelectric detection substrate usually has a PD built on the TFT to increase the photosensitive area of the PD and improve the detection efficiency. The inventors have found that the layout of the PD on the TFT makes the overall structure thicker, and the deformation of the substrate is easily caused by stress, resulting in damage of the film layer and a low yield. In addition, the stacked structure of the TFT and the PD needs to sequentially fabricate a TFT and a PD, and the number of patterning processes is large, the fabrication process is complicated and cumbersome, and the production cost is high.

In order to overcome the defects of a low yield and high production cost of the existing TFT and PD stack structure, embodiments of the present disclosure provide a photoelectric detection substrate, the main structure of the photoelectric detection substrate comprising a TFT and a PD are coplanar. In some embodiments, the TFT may have a vertical channel structure. In an embodiment according to the present disclosure, the TFT and the PD are coplanar structures, meaning that both the TFT and the PD are juxtaposed to form a structure on the same horizontal plane, which is a plane parallel to the substrate. The TFT of the vertical channel structure means that the source electrode and the drain electrode are respectively disposed on the upper and lower sides of the active layer, that is, the drain electrode, the active layer, and the source electrode are stacked in this order in a direction perpendicular to the surface of the base.

According to the photoelectric detection substrate provided by the embodiment of the present disclosure, by forming a coplanar structure of the TFT of a vertical channel structure and the PD, the overall thickness of the photoelectric detection substrate is effectively reduced, the deformation of the substrate caused by the stress is reduced, the damage caused by the deformation of the substrate is avoided, and the yield of product is improved. At the same time, due to the coplanar structure, the TFT and the PD can be fabricated simultaneously, which reduces the number of patterning processes, simplifies the fabrication process, and reduces the production cost. In addition, since the TFT of the vertical channel structure has a small footprint, the photosensitive area of the PD can be increased, thereby improving detection efficiency and improving resolution. The photoelectric detection substrate according to the embodiment of the present disclosure can be used as a substrate of an X-ray Digital Radiography device, a substrate of a fingerprint recognition device, a substrate of an image recognition device, and the like, and has a wide application prospect.

FIG. 1 is a schematic structural view of a photoelectric detection substrate according to an embodiment of the present disclosure. As shown in FIG. 1, the structure of the photoelectric detection substrate comprises a TFT and a PD which is coplanar with the TFT. The TFT and the PD are simultaneously formed on the base 10, where the TFT has a vertical channel structure. The TFT comprises a gate electrode 17, an active layer 14, a first electrode 12, and a second electrode 19. The PD comprises a lower electrode 21, an upper electrode 25, a first doped layer 22, a second doped layer 24, and an absorption layer (also referred as an intrinsic layer) 23 in-between. And the first electrode 12 of the TFT is electrically connected to the lower electrode 21 of the PD.

Further, the TFT further comprises a first contact layer 11 and a second contact layer 15. The first contact layer 11 is disposed under the active layer 14 for establishing a connection between the first electrode 12 and the active layer 14. The second contact layer 15 is disposed above the active layer 14 for establishing a connection between the second electrode 19 and the active layer 14. The PD further comprises an electrode lead 26 connected to the upper electrode 25. The upper electrode 25 is connected to the second doped layer 24, and the lower electrode 21 is connected to the first doped layer 22.

As shown in FIG. 1, in the simultaneously fabricated TFT and PD, the first electrode 12 of the TFT and the lower electrode 21 of the PD are disposed in a same layer and formed by a same patterning process, while an electricity connection is established through the first contact layer 11. The active layer 14 of the TFT and the absorption layer 23 of the PD are disposed in a same layer and formed by a same patterning process. The second contact layer 15 of the TFT and the second doped layer 24 of the PD are disposed in a same layer and formed by a same patterning process. The second electrode 19 of the TFT and the electrode lead 26 of the PD are disposed in a same layer and formed by a same patterning process.

The structure of a TFT and a PD will be described in detail thereafter in terms of both, respectively.

In an embodiment, as shown in FIG. 1, the TFT of the photoelectric detection substrate comprises:

a first contact layer 11 disposed on the base 10;

a first electrode 12 disposed on the base 10 and having one end connected to the first contact layer 11;

a first insulating layer 13 covering the first contact layer 11 and the first electrode 12, with a first via K1 exposing the first contact layer 11 being formed on the first insulating layer 13;

an active layer 14 disposed on the first insulating layer 13, the active layer 14 being connected to the first contact layer 11 through the first via K1;

a second contact layer 15 disposed on the active layer 14;

a second insulating layer 16 covering the active layer 14 and the second contact layer 15;

a gate electrode 17 disposed on the second insulating layer 16, the gate electrode 17 being at sidewalls of the active layer 14;

a third insulating layer 18 covering the gate electrode 17, with a second via K2 exposing the second contact layer 15 being formed on the third insulating layer 18;

a second electrode 19 disposed on the third insulating layer 18, the second electrode 19 being connected to the second contact layer 15 through the second via K2;

a fourth insulating layer 20 covering the second electrode 19.

In some embodiments, the first contact layer 11, the active layer 14 and the second contact layer 15 are stacked in this order. The first electrode 12 is connected to the active layer 14 through the first contact layer 11, and the second electrode 19 is connected to the active layer 14 through the second contact layer 15. The gate electrode 17 is disposed on sidewalls on both sides of the active layer 14 to form a TFT of a vertical channel structure. In an embodiment of the present disclosure, the first electrode 12 is a drain electrode, the second electrode 19 is a source electrode, and the first contact layer 11 and the second contact layer 15 are N-doped semiconductors. In actual implementation, it may also be possible that the first electrode is the source electrode, the second electrode is the drain electrode and the first contact layer 11 and the second contact layer 15 are P-doped semiconductors. The semiconductor may be amorphous silicon or polycrystalline silicon.

In an embodiment, as shown in FIG. 1, the PD of the photoelectric detection substrate comprises:

a lower electrode 21 disposed on the base 10, one end of the lower electrode 21 being connected to the first contact layer 11;

a first insulating layer 13 covering the lower electrode 21, with a third via K3 exposing the lower electrode 21 being formed on the first insulating layer 13;

a first doped layer 22 disposed on the first insulating layer 13, the first doped layer 22 being connected to the lower electrode 21 through the third via K3;

an absorption layer 23 disposed on the first doped layer 22;

a second doped layer 24 disposed on the absorption layer 23;

an upper electrode 25 disposed on the second doped layer 24;

a second insulating layer 16 covering the upper electrode 25, the second doped layer 24, the absorption layer 23 and the first doped layer 22;

a third insulating layer 18 covering the second insulating layer 16, with a fourth via K4 exposing the upper electrode 25 being formed on the third insulating layer 18;

an electrode lead 26 disposed on the third insulating layer 18, the electrode lead 26 being connected to the upper electrode 25 through the fourth via K4;

a fourth insulating layer 20 covering the electrode lead 26.

In some embodiments, the first doped layer 22, the absorption layer 23 and the second doped layer 24 are stacked in this order, the lower electrode 21 is connected to the first doped layer 22, and the upper electrode 25 is connected to the second doped layer 24, to form a PD. At the same time, the lower electrode 21 is connected to the first electrode 12 of the TFT through the first contact layer 11 to realize connection between the TFT and the PD, so that the sensing signal obtained by the PD is output to the external data processing circuit through the TFT. The upper electrode 25 disposed on the second doped layer 24 is retracted, that is, the orthographic projection of the upper electrode 25 on the base 10 is smaller than the orthographic projection of the absorption layer 23 on the base 10 and is within the range of the orthographic projection the absorption layer 23 on the base 10. In an embodiment of the present disclosure, the first doped layer 22 is a P-doped semiconductor, and the second doped layer 24 is an N-doped semiconductor. In actual implementation, it may also be possible that the first doped layer 22 is an N-doped semiconductor, the second doped layer 24 is a P-doped semiconductor, and the semiconductor may be amorphous silicon or polycrystalline silicon.

In an embodiment, as shown in FIG. 1, the photoelectric detection substrate comprises a vertical channel TFT and a PD which is coplanar with the TFT, and specifically comprises:

a first contact layer 11 disposed on the base 10;

a first electrode 12 and a lower electrode 21 disposed on the base 10 and respectively connected to the first contact layer 11;

a first insulating layer 13 covering the first contact layer 11, the first electrode 12 and the lower electrode 21, with a third via K3 exposing the lower electrode 21 and a first via K1 exposing the first contact layer 11 being formed on the first insulating layer 13;

a first doped layer 22 disposed on the first insulating layer 13, the first doped layer 22 being connected to the lower electrode 21 through the third via K3;

an active layer 14 disposed on the first insulating layer 13 and an absorption layer 23 disposed on the first doped layer 22, the active layer 14 being connected to the first contact layer 11 through the first via K1;

a second contact layer 15 disposed on the active layer 14 and a second doped layer 24 disposed on the absorption layer 23;

an upper electrode 25 disposed on the second doped layer 24, the orthographic projection of the upper electrode 25 on the base being smaller than the orthographic projection of the absorption layer 23 on the base, and being within the range of the orthographic projection of the absorption layer 23 on the base;

a second insulating layer 16 covering the active layer 14, the second contact layer 15, the upper electrode 25, the second doped layer 24, the absorption layer 23 and the first doped layer 22;

a gate electrode 17 disposed on the second insulating layer 16, the gate electrode 17 being at sidewalls of the active layer 14;

a third insulating layer 18 covering the gate electrode 17, with a second via K2 exposing the second contact layer 15 and a fourth via K4 exposing the upper electrode 25 being formed on the third insulating layer 18;

a second electrode 19 and an electrode lead 26 disposed on the third insulating layer 18, the second electrode 19 being connected to the second contact layer 15 through the second via K2, and the electrode lead 26 being connected to the upper electrode 25 through the fourth via K4;

a fourth insulating layer 20 covering the second electrode 19 and the electrode lead 26. The fourth insulating layer 20 may be made from a resin material for planarizing the upper surface of the photoelectric detection substrate.

In the photoelectric detection substrate according to an embodiment of the present disclosure, the first electrode 12 of the TFT and the lower electrode 21 of the PD are disposed in a same layer, and may be formed by a same patterning process; the active layer 14 of the TFT and the absorption layer 23 of the PD are disposed in a same layer, and may be formed by a same patterning process; the second contact layer 15 of the TFT and the second doped layer 24 of the PD are disposed in a same layer, and may be formed by a same patterning process; the second electrode 19 of the TFT and the electrode lead 26 of the PD are disposed in a same layer, and may be formed by a same patterning process; the second via K2 and the fourth via K4 of the third insulating layer 18 may be formed by a same patterning process. Thus, a PD is simultaneously fabricated in the fabrication of the TFT, and a TFT and a PD which is coplanar with the TFT are formed on the base, where the TFT may have a vertical channel structure.

Since the second contact layer 15 of the TFT and the second doped layer 24 of the PD are disposed in a same layer and may be formed by a same patterning process, the materials of the second contact layer 15 and the second doped layer 24 may be the same. When the second contact layer 15 and the second doped layer 24 are N-doped semiconductors, the first doped layer 22 may be a P-doped semiconductor, and the first contact layer 11 may be an N-doped semiconductor. Of course, if the second contact layer 15 and the second doped layer 24 are P-type semiconductors, the first doped layer 22 may be an N-doped semiconductor, and the first contact layer 11 may be a P-doped semiconductor.

The technical solution of the embodiment of the present disclosure will be further described below by the fabrication process of the photoelectric detection substrate. The "patterning process" referred to in the embodiments of the present disclosure comprises processes of depositing a film layer, coating a photoresist, mask exposure, development, etching, stripping photoresist, etc., which are common fabrication processes in the related art. The deposition may be carried out by a known process such as sputtering, evaporation, chemical vapor deposition, or the like. The coating may be carried out by a known coating process, and the etching may be carried out by a known method, which are not specifically limited herein.

Figure 2:
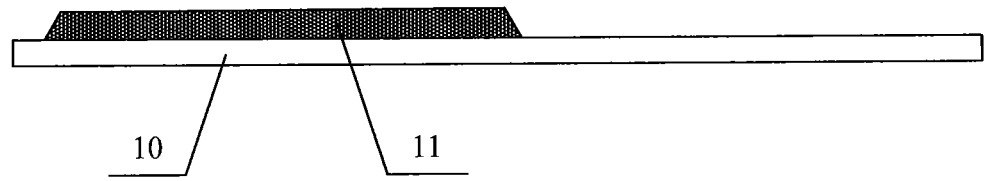
FIG. 2 is a schematic diagram of a photoelectric detection substrate after forming a first contact layer pattern according to an embodiment of the present disclosure.

Firstly, a first contact layer pattern is formed. Forming the first contact layer pattern may comprise: depositing a contact layer film on the base, coating a layer of photoresist on the contact layer film, exposing and developing the photoresist by using a monotone mask, thereby an unexposed area being formed at the position of the first contact layer pattern where the photoresist is retained, while a fully exposed area being formed at other positions where there is no photoresist and the contact layer film is exposed; etching the contact layer film being exposed in the fully exposed area and stripping the remaining photoresist, and forming a pattern of the first contact layer 11 of the TFT on the base 10, as shown in FIG. 2. For example, the base may be a glass base, a quartz base, a silicon wafer, a PI plastic base, etc., and the deposited contact layer film may be formed by directly depositing an amorphous silicon doping material or a polycrystalline silicon doping material, or may formed by firstly depositing an amorphous silicon film or the polycrystalline silicon film and then performing ion implantation treatment to form a contact layer film. In this embodiment, the contact layer film (also referred to as an ohmic contact layer) may be N-doped amorphous silicon. After direct deposition, a first contact layer 11 is formed by a patterning process for establishing a connection between the active layer and the first electrode in the TFT while establishing a connection between the TFT and the PD.

Figure 3:
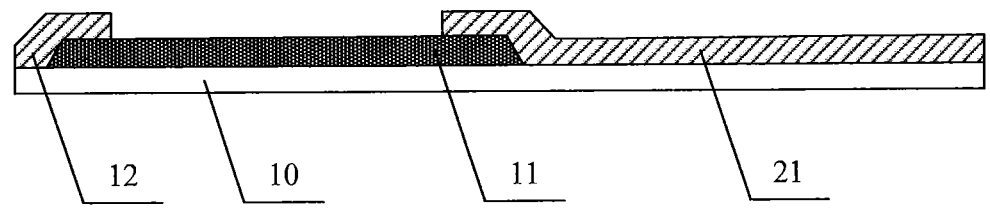
FIG. 3 is a schematic diagram of a photoelectric detection substrate after forming a first electrode and a lower electrode pattern according to an embodiment of the present disclosure.

Subsequently, a first electrode and lower electrode pattern is formed. Forming the first electrode and lower electrode pattern may comprise: depositing a metal film on the base on which the foregoing pattern is formed, coating a layer of photoresist on the metal film, exposing and developing the photoresist by using a monotone mask, thereby an unexposed area being formed at the position of first electrode and lower electrode pattern where the photoresist is retained while a fully exposed area being formed at other positions where there is no photoresist and the metal film is exposed; etching the metal film being exposed in the fully exposed area and stripping the remaining photoresist. A pattern of the first electrode 12 of the TFT and the lower electrode 21 of the PD is formed on the base 10. An end of the first electrode 12 adjacent to the lower electrode 21 is disposed on the first contact layer 11, and an end of the lower electrode 21 adjacent to the first electrode 12 is also disposed on the first contact layer 11, so that the first electrode 12 and the lower electrode 21 are both connected to the first contact layer 11, as shown in FIG. 3. For example, the metal thin film may be made from a metal such as silver (Ag), molybdenum (Mo), aluminium (Al), or copper (Cu), or a composite layer structure of a plurality of metals. In some embodiments, the first electrode 12 is a drain electrode of a TFT.

Figure 4:
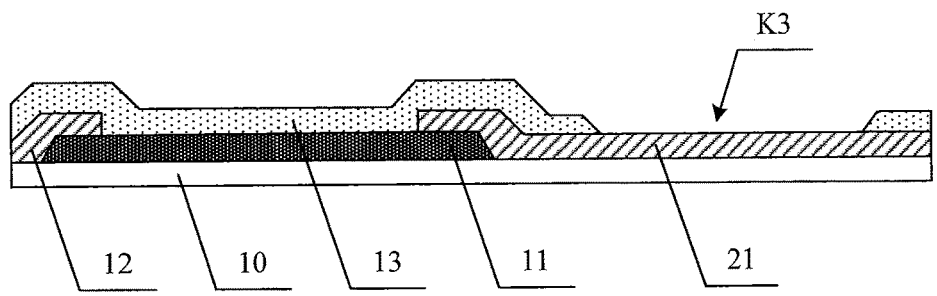
FIG. 4 is a schematic diagram of a photoelectric detection substrate after forming a first insulating layer pattern with a third via formed according to an embodiment of the present disclosure.

Subsequently, a first insulating layer pattern having a third via is formed. Forming the first insulating layer pattern having the third via may comprise: depositing an insulating layer film on the base on which the foregoing pattern is formed, coating a layer of photoresist on the insulating layer film, exposing and developing the photoresist using a monotone mask, thereby a fully exposed area being formed at the position of the third via pattern where the photoresist is removed, while an unexposed area being formed at other positions where the photoresist is retained; etching the insulating layer film being exposed in the fully exposed area and stripping the remaining photoresist, to form a pattern of the first insulating layer 13 having the third via K3, where the third via K3 is at the position of the lower electrode 21. The insulating layer film in the third via K3 is etched, and the surface of the lower electrode 21 is exposed, as shown in FIG. 4. For example, the first insulating layer may be made from silicon nitride SiNx, silicon oxide SiOx or silicon oxynitride SiOxNx, or a composite film of SiNx/SiOx, SiNx/SiOxNx, SiOxNx/SiOx or SiNx/SiOx/SiOxNx.

Figure 5:
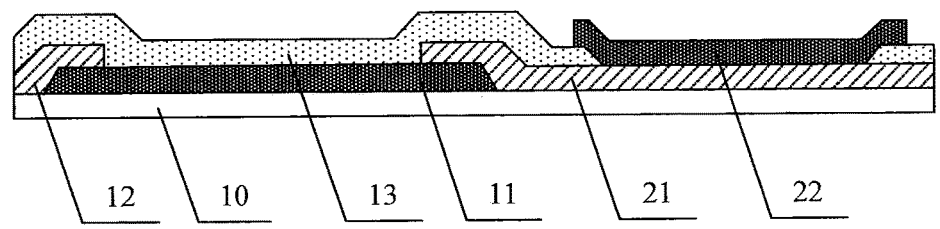
FIG. 5 is a schematic diagram of a photoelectric detection substrate after forming a first doped layer pattern according to an embodiment of the present disclosure.

Subsequently, a first doped layer pattern is formed. Forming the first doped layer pattern may comprise: depositing a first doped layer film on the base on which the foregoing pattern is formed, patterning the first doped layer film by a patterning process, and forming a pattern of the first doped layer 22 of the PD on the first insulating layer 13, where the first doped layer 22 is connected to the lower electrode 21 through a third via K3, as shown in FIG. 5. For example, the first doped layer film may be deposited by directly depositing an amorphous silicon doping material or a polycrystalline silicon doping material, or may be formed by firstly depositing an amorphous silicon film or a polycrystalline silicon film and then performing ion implantation treatment to form a doped layer film. In some embodiments, the first doped layer film may be P-doped amorphous silicon. After direct deposition, a first doped layer 22 of P-doped amorphous silicon is formed by a patterning process.

Figure 6:
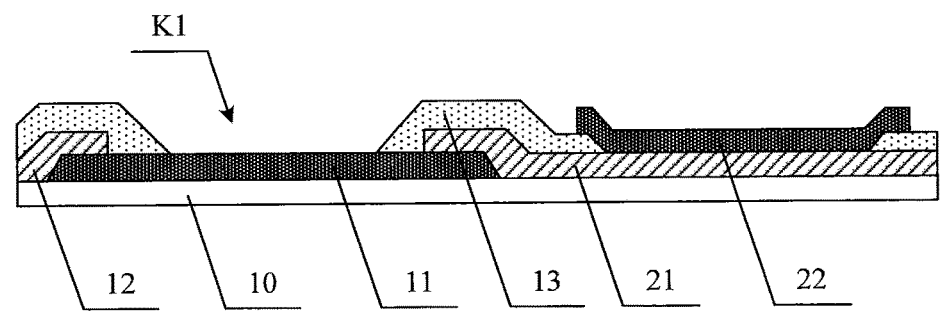
FIG. 6 is a schematic diagram of a photoelectric detection substrate after forming a first via pattern on a first insulating layer according to an embodiment of the present disclosure.

Subsequently, a first via pattern on the first insulating layer is formed. Forming the first via pattern on the first insulating layer may comprise: coating a layer of photoresist on the base on which the foregoing pattern is formed, patterning the first insulating layer 13 by a patterning process, forming a first via K1 pattern on the first insulating layer 13, where the first via K1 is located at a position of the first contact layer 11 between the first electrode 12 and the lower electrode 21, and etching the first insulating layer 13 in the first via K1 to expose the surface of the first contact layer 11, as shown in FIG. 6.

Figure 7:
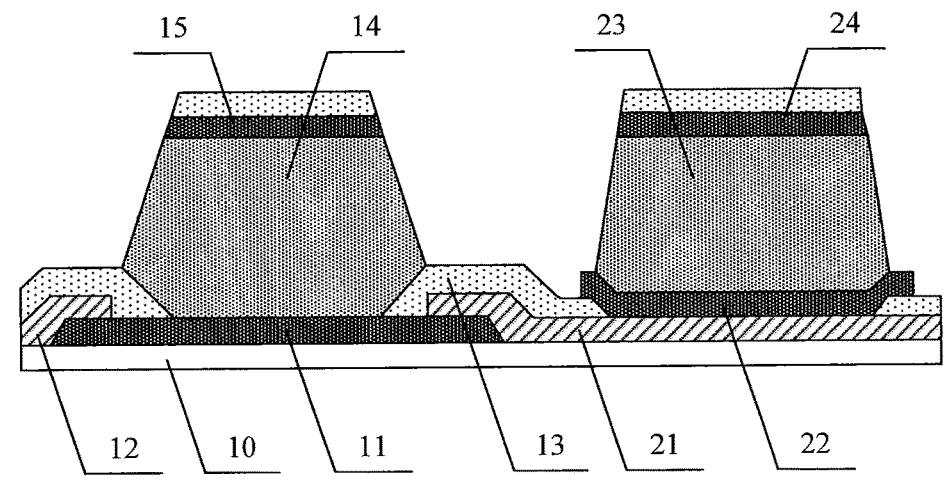
FIG. 7 is a schematic diagram of a photoelectric detection substrate after forming an active layer and an absorption layer pattern according to an embodiment of the present disclosure.

Subsequently, an active layer and absorption layer pattern is formed. Forming the active layer and absorption layer pattern may comprise: depositing an intrinsic layer film, a second doped layer film, and a transparent conductive film in this order on the base on which the foregoing pattern is formed, coating a layer of photoresist on the transparent conductive film, and patterning the intrinsic layer film, the second doped layer film, and the transparent conductive film by a patterning process to form an active layer 14 pattern of the TFT and an absorption layer 23 pattern of the PD. The active layer 14 is connected to the first contact layer 11 through the first via K1, the second contact layer 15 of the TFT is formed over the active layer 14, and the second contact layer 15 is covered with a transparent conductive film; the absorption layer 23 is above the first doped layer 22, a second doped layer 24 of the PD is formed over the absorption layer 23, and the second doped layer 24 is covered with a transparent conductive film, as shown in FIG. 7. Fox example, the patterning process may be performed by firstly performing patterning of the transparent conductive film, and then etching the intrinsic layer film and the second doped layer film by using a patterned transparent conductive film as a hard mask, to form an active layer and an absorption layer pattern. Fox example, the intrinsic layer film may be amorphous silicon or polycrystalline silicon, the second doped layer film is made from amorphous silicon doping material or polycrystalline silicon doping material, and the transparent conductive film may be indium tin oxide ITO or indium zinc oxide IZO. In some embodiments, the intrinsic layer film adopts amorphous silicon to form an amorphous silicon active layer 14 and an amorphous silicon absorption layer 23, and the second doped layer film adopts N-doped amorphous silicon to form a second contact layer 15 of N-doped amorphous silicon and a second doped layer 24 of N-doped amorphous silicon. Thus, the active layer 14 of the TFT and the absorption layer 23 of the PD are disposed in a same layer, and the second contact layer 15 of the TFT and the second doped layer 24 of the PD are disposed in a same layer and may be formed by a same patterning process. The first doped layer 22 and the absorption layer 23 of the P-doped amorphous silicon and second contact layer 15 of the N-doped amorphous silicon constitute a PD. The first contact layer 11 and the active layer 14 of N-doped amorphous silicon and the second contact layer 15 of N-doped amorphous silicon constitute an active region of the TFT.

Figure 8:
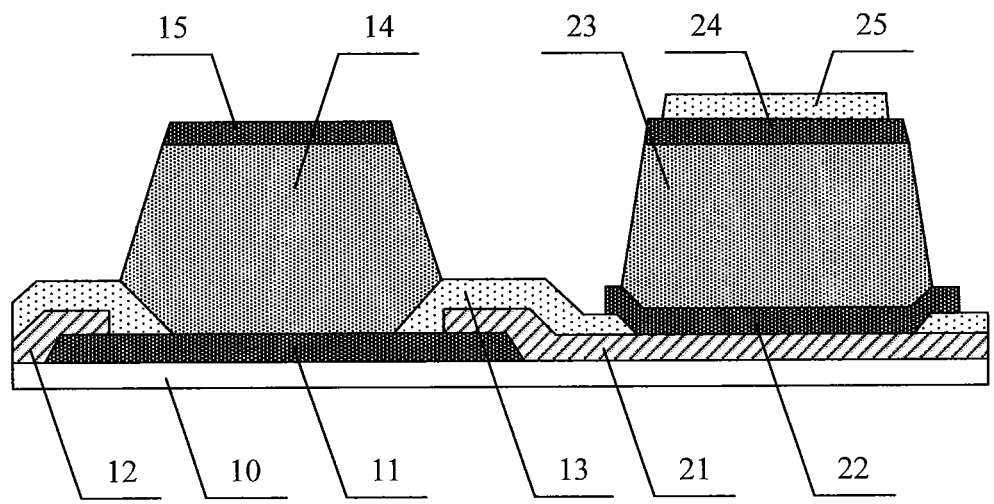
FIG. 8 is a schematic diagram of a photoelectric detection substrate after forming an upper electrode pattern according to an embodiment of the present disclosure.

Subsequently, an upper electrode pattern is formed. Forming the upper electrode pattern may comprises: coating a layer of photoresist on the base on which the foregoing pattern is formed, patterning the transparent conductive film covering the second contact layer 15 and the second doped layer 24 by a patterning process, and removing the transparent conductive film covering the second contact layer 15, so that both sides of the transparent conductive film covering the second doped layer 24 are inwardly retracted, and the upper electrode 25 pattern of the PD is formed over the second doped layer 24, as shown in FIG. 8.

Figure 9:
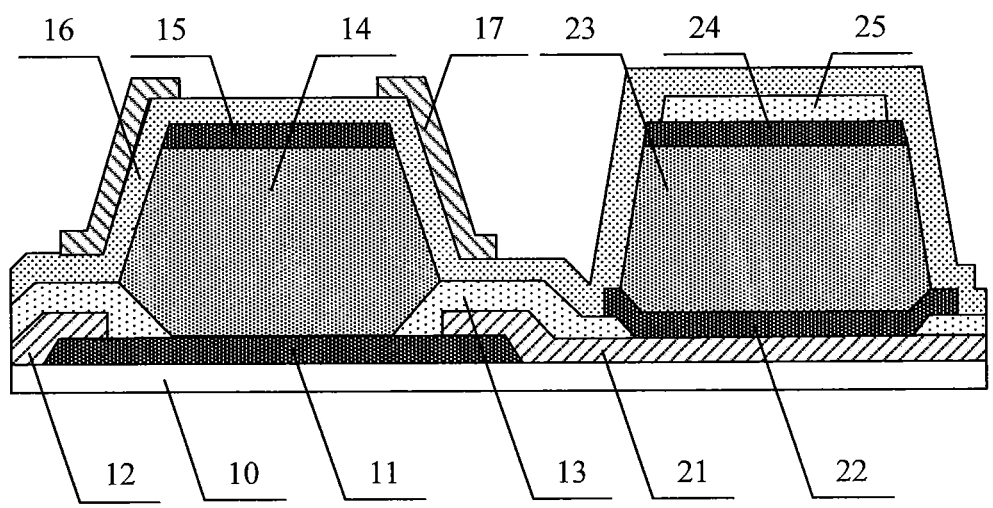
FIG. 9 is a schematic diagram of a photoelectric detection substrate after forming a gate electrode pattern according to an embodiment of the present disclosure.

Subsequently, a gate electrode pattern is formed. Forming the gate electrode pattern may comprises: depositing an insulating layer film and a metal film in this order on the base on which the foregoing pattern is formed, patterning the metal film by a patterning process to form a pattern of the second insulating layer 16 and the gate electrode 17, where the second insulating layer 16 covers the active layer 14 and the second contact layer 15 of the TFT and covers the absorption layer 23, the second doped layer 24 and the upper electrode 25 of the PD, and the gate electrode 17 is formed on the second insulating layer 16 at the sidewalls of the active layer 14, as shown in FIG. 9. Fox example, the second insulating layer may be made from SiNx, SiOx or SiOxNx, or a composite film of SiNx/SiOx, SiNx/SiOxNx, SiOxNx/SiOx or SiNx/SiOx/SiOxNx. The gate electrode may be made from a metal such as silver (Ag), molybdenum (Mo), aluminium (Al), or copper (Cu), or a composite layer structure of a plurality of metals.

In some embodiments, the inward retraction of the upper electrode 25 can be used to cooperate with the first insulating layer 13 and the second insulating layer 16 to avoid the electric leakage at sidewall position. The inward retraction of the upper electrode 25 means that the orthographic projection of the upper electrode 25 on the base is smaller than the orthographic projection of the absorption layer on the base, and the orthographic projection of the upper electrode 25 on the base is within the range of the orthographic projection of the absorption layer on the base. The width of the upper electrode is smaller than the width of the absorption layer. When an electric field is formed between the upper electrode and the lower electrode, the electric field strength at the two sidewall positions of the absorption layer is small, and thus the amount of electric leakage at the two sidewall positions of the absorption layer is small. At the same time, the first insulating layer 13 and the second insulating layer 16 cover the two sidewalls of the absorption layer, so that electric leakage at the sidewalls may be avoided. Thus, a structure in which the lower electrode 21 and the upper electrode 25 are connected to the PD is formed.

Figure 10:
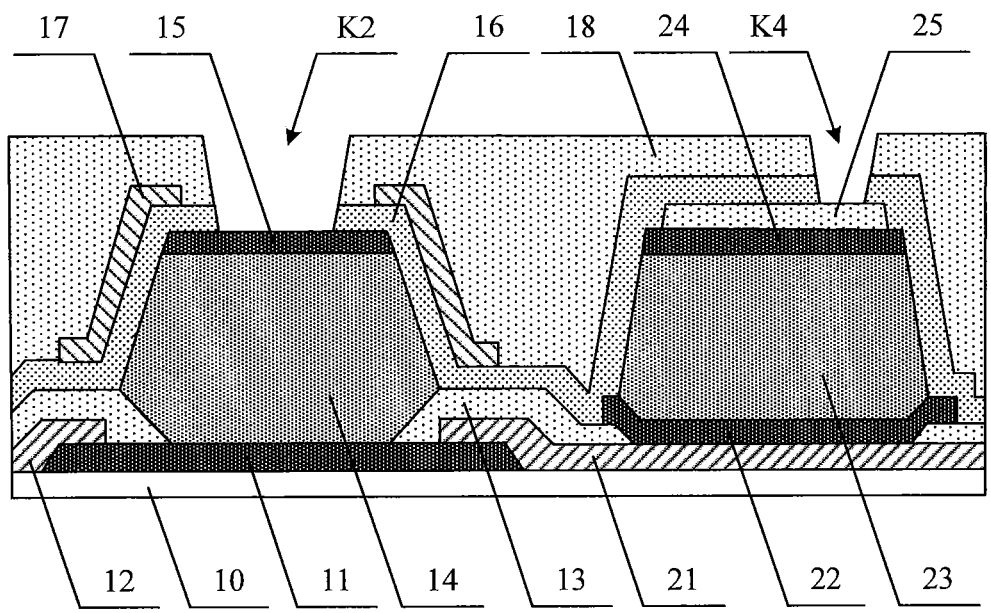
FIG. 10 is a schematic diagram of a photoelectric detection substrate after forming a third insulating layer pattern according to an embodiment of the present disclosure.

Subsequently, a third insulating layer pattern having the second via and the fourth via is formed. Forming the third insulating layer pattern having the second via and the fourth via may comprise: depositing an insulating layer film on the base on which the foregoing pattern is formed, coating a layer of photoresist on the insulating layer film, patterning the insulating layer film and the second insulating layer 16 by a patterning process, to form a pattern of the third insulating layer 18 having the second via K2 and the fourth via K4, where the second via K2 is at the position of the second contact layer 15, and etching the third insulating layer 18 and the second insulating layer 16 in the via K2 to expose the surface of the second contact layer 15. The fourth via K4 is at the position of the upper electrode 25, and the third insulating layer 18 and the second insulating layer 16 in the fourth via K4 are etched to expose the surface of the upper electrode 25, as shown in FIG. 10. Fox example, the third insulating layer may be made from a resin material for planarization.

Figure 11:
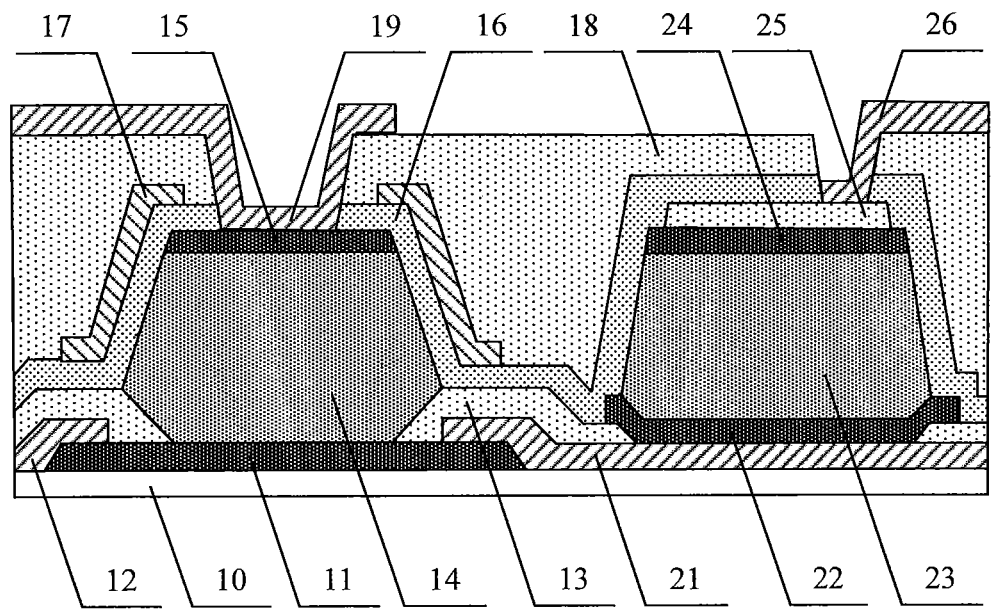
FIG. 11 is a schematic diagram of a photoelectric detection substrate after forming a second electrode and an electrode lead pattern according to an embodiment of the present disclosure.

Subsequently, a second electrode and electrode lead pattern is formed. Forming the second electrode and electrode lead pattern may comprise: depositing a metal thin film on the base on which the foregoing pattern is formed, patterning the metal thin film by a patterning process, to form a pattern of the second electrode 19 of the TFT and the electrode lead 26 of the PD, where the second electrode 19 is connected to the second contact layer 15 through the second via K2, and the electrode lead 26 is connected to the upper electrode 25 through the fourth via K4, as shown in FIG. 11. Fox example, the second electrode and the electrode lead are made form a metal such as silver (Ag), molybdenum (Mo), aluminium (Al), or copper (Cu), or a composite layer structure of a plurality of metals. In some embodiments, the second electrode 19 is the source electrode of the TFT.

The subsequent process may comprise the step of depositing a fourth insulating layer 20 covering the second electrode 19 and the electrode lead 26 or other steps, thereby completing the fabrication of the photoelectric detection substrate of the coplanar structure according to the embodiment of the present disclosure as shown in FIG. 1. When the photoelectric detection substrate is used as the substrate of the X-ray Digital Radiography device, the subsequent process further comprises forming a structure such as a scintillation layer and an encapsulation layer. The structure and fabrication means of the structure such as the scintillation layer and the encapsulation layer are the same as those in the related art, and are not described herein.

As can be seen from the foregoing description, in the embodiment of the present disclosure, the first electrode of the TFT and the lower electrode of the PD are disposed in a same layer and may be formed by a same patterning process, and the active layer of the TFT and the absorption layer of the PD are disposed in a same layer and may be formed by a same patterning process, the second contact layer of the TFT and the second doped layer of the PD are disposed in a same layer and may be formed by a same patterning process, and the second electrode of the TFT and the electrode lead of the PD are disposed in a same layer and may be formed by a same patterning process, thereby realizing the simultaneous fabrication of the coplanar structure of the TFT of a vertical channel structure and the PD. Compared with the existing solution of the stacked structure of TFT and PD, the photoelectric detection substrate according to the embodiment of the present disclosure minimizes the overall thickness, reduces the deformation of the substrate caused by stress, avoids damage caused by deformation of the substrate, and improves the yield. At the same time, the existing solution requires 12 to 13 patterning processes, while the structure according to the embodiment of the present disclosure significantly reduces the number of patterning processes, simplifies the fabrication process, and reduces the production cost. Further, since the TFT adopts a vertical channel structure, the footprint of the TFT is only 40% to 50% of the footprint of the TFT of a horizontal channel structure, thereby maximally increasing the photosensitive area of the PD, increasing the signal amount, and effectively improving detection efficiency and resolution. In addition, the TFT of the vertical channel structure is also advantageous for improving the alignment accuracy in the fabrication, and is advantageous for improving the product quality.

The photoelectric detection substrate proposed by the embodiment of the present disclosure realizes structural optimization for improving the working performance of the TFT and the PD while realizing simultaneous fabrication of the TFT and the PD. For example, by providing the same layer structure of the first electrode and the lower electrode, the first electrode and the second electrode can be prevented from facing each other directly, thereby reducing the overall leakage current of the TFT. At the same time, the active layer is disposed to be connected to the first contact layer through the first via, and the first via can be used to reduce the leakage current at the TFT sidewalls. Further, the first doped layer is disposed to be connected to the lower electrode through the third via, and the third via can be used to reduce the leakage current at the PD sidewalls. Combining with the inwardly retraction structure of the upper electrode, this minimizes the overall leakage current of the PD.

In terms of the planar structure of the photoelectric detection substrate, the photoelectric detection substrate may comprise a plurality of gate lines and a plurality of signal lines formed on the base, each row of the gate lines intersecting with each column of the signal lines perpendicularly, forming a plurality of pixel areas arranged in a matrix on the base, each of which is provided with a TFT of a vertical channel structure and a PD. The gate line is connected to the gate electrode of the TFT for supplying a scan signal to the corresponding TFT. The TFT is turned on in response to the gate line scan signal, thereby transmitting the sensing signal from the PD to the signal line, and the signal line outputs the sensing signal to an external data processing circuit.

It should be noted that the foregoing description is only an instance of fabricating a photoelectric detection substrate, and the present disclosure is not specifically limited herein. In actual implementation, the fabrication process can be adjusted according to actual needs. For example, the fabrication process of FIGS. 7 and 8 can also be accomplished by a same patterning process using a grey tone mask.

Based on the technical concept of the present disclosure, an embodiment of the present disclosure further provides a method for fabricating a photoelectric detection substrate. The method for fabricating the photoelectric detection substrate comprises:

forming a TFT and a PD which is coplanar with the TFT on a base by a same fabrication process. In some embodiments, the TFT has a vertical channel structure.

Forming a TFT and a PD which is coplanar with the TFT on a base by a same fabrication process comprises:

S1, forming a first contact layer and a first electrode of the TFT and a lower electrode and a first doped layer of the PD on the base, the first electrode and the lower electrode being disposed in a same layer and formed by a same patterning process;

S2, forming an active layer and a second contact layer of the TFT, and an absorption layer, a second doped layer and an upper electrode of the PD; the active layer and the absorption layer being disposed in a same layer and formed by a same patterning process, the second contact layer and the second doped layer being disposed in a same layer and formed by a same patterning process, and the active layer being connected to the first contact layer through the first via;

S3, forming a gate electrode and a second electrode of the TFT, and an electrode lead of the PD, the second electrode and the electrode lead being disposed in a same layer and formed by a same patterning process, and the second electrode being connected to the second contact layer through a second via.

In some embodiments, the step S1 comprises:

S11, forming a first contact layer on the base;

S12, forming a first electrode and a lower electrode, wherein the respective ends of the first electrode and the lower electrode which are adjacent to each other are connected to the first contact layer, respectively;

S13, forming a first insulating layer covering the first electrode and the lower electrode, with a third via exposing the lower electrode being formed on the first insulating layer;

S14, forming a first doped layer on the first insulating layer, the first doped layer being connected to the lower electrode through the third via.

In some embodiments, the step S2 comprises:

S21, forming the first via exposing the first contact layer on the first insulating layer;

S22, forming an active layer and a second contact layer of the TFT, as well as an absorption layer, a second doped layer and an upper electrode of the PD by a patterning process; wherein the active layer is connected with the first contact layer through the first via, the second contact layer is on the active layer, the absorption layer is on the first doped layer, the second doped layer is on the absorption layer, and the upper electrode is on the second doped layer.

In some embodiments, the step S22 comprises:

S221, depositing an intrinsic layer film, a second doped layer film, and a transparent conductive film in this order;

S222, patterning the intrinsic layer film, the second doped layer film, and the transparent conductive film by a first patterning process to form the active layer and the second contact layer of the TFT, as well as the absorption layer and the second doped layer of the PD, wherein the second contact layer and the second doped layer are covered with the transparent conductive film;

S223, patterning the transparent conductive film covering the second contact layer and the second doped layer by a second patterning process, removing the transparent conductive film on the second contact layer, so that the transparent conductive film on the second doped layer is inwardly retracted, and the upper electrode is formed on the second doped layer.

In some embodiments, the step S3 comprises:

S31, depositing an insulating layer film and a metal film in this order, forming a second insulating layer and a gate electrode by a patterning process, wherein the gate electrode is at a sidewall of the active layer;

S32, forming a third insulating layer covering the gate electrode, with a second via exposing the second contact layer and a fourth via exposing the upper electrode being formed on the third insulating layer;

S33, forming a second electrode and an electrode lead on the third insulating layer, wherein the second electrode is connected to the second contact layer through the second via, and the electrode lead is connected to the upper electrode through the fourth via.

The method for fabricating a photoelectric detection substrate further comprises forming a fourth insulating layer, the fourth insulating layer covering the second electrode and the electrode lead.

In actual implementation, when the photoelectric detection substrate is used as the substrate of the X-ray Digital Radiography device, the subsequent process further comprises the steps of forming a scintillation layer and an encapsulation layer etc.

The specific content of the method for fabricating the photoelectric detection substrate according to the embodiment of the present disclosure has been described in detail in the foregoing photoelectric detection substrate fabrication process, and details are not described herein.

The method for fabricating a photoelectric detection substrate provided by the embodiment of the present disclosure has realised the simultaneous fabrication of a vertical TFT and a PD which is coplanar with the TFT by: forming the first electrode of the TFT and the lower electrode of the PD in a same patterning process, forming the active layer of the TFT and the absorption layer of the PD in a same patterning process; forming the second contact layer of the TFT and the second doped layer of the PD in a same patterning process, and forming the second electrode of the TFT and the electrode lead of the PD in a same patterning process. Compared with the existing method for fabrication which requires 12 to 13 patterning processes, the embodiment of the present disclosure significantly reduces the number of patterning processes, simplifies the fabrication process, reduces the production cost, improves the alignment accuracy in the fabrication, and improves the product quality. At the same time, the fabricated photoelectric detection substrate minimizes the overall thickness, reduces the deformation of the substrate caused by the stress, avoids the damage caused by the deformation of the substrate, and improves the yield. Since the fabricated TFT adopts a vertical channel structure, the footprint of the TFT is only 40% to 50% of the footprint of a TFT of a horizontal channel structure, so that the photosensitive area of the PD may be maximized, the signal amount may be increased, and the resolution may be improved.

Based on the same inventive concept, the embodiments of the present disclosure also provide a photoelectric detection device comprising the above-described photoelectric detection substrate. The photoelectric detection device may be an X-ray Digital Radiography device, a fingerprint recognition device, or an image recognition device, etc. When the photoelectric detection device is an X-ray Digital Radiography device, the photoelectric detection device may be applied to a medical examination, and the signal detected by the photoelectric detection device is transmitted to a control device (such as a computer). The control device converts the signal into an image signal, and controls the display device to display a corresponding image, so that the distribution of the X-rays can be viewed visually.

In the description of the embodiments of the present disclosure, it is to be understood that the orientation or positional relationship indicated by the terms "middle", "upper", "lower", "front", "back", "vertical", "horizontal", "top", "bottom", "inside" and "outside" and the like is based on the orientation or positional relationship shown in the drawings, and is merely for the convenience of describing the present disclosure and the simplified description, and does not indicate or imply the indicated device or component must be in a particular orientation or be constructed or operated in the particular orientation, and is not to be construed as limiting the disclosure.

In the description of the embodiments of the present disclosure, it should be noted that the terms "installation", "connected", and "connection" are to be understood broadly unless otherwise specified or defined. For example, it may be a fixed connection, a detachable connection, or an integral connection. It may be a mechanical connection or an electrical connection. It may be directly connected or indirectly connected through an intermediate medium, or may be internal connection between the two components. The specific meanings of the above terms in the present disclosure may be understood in the specific context by those skilled in the art.

As will be apparent to those skilled in the art, many different ways of performing the methods of these embodiments of the present disclosure are possible. For example, the order of the steps may be changed, or some steps may be performed in parallel. In addition, other method steps may be inserted between the steps. The inserted step may represent such as an improvement of a method described herein, or may be independent of the method. In addition, the given step may not have been fully completed before the next step begins.

The implementations disclosed in the present disclosure are as described above, but are merely used to facilitate the understanding of the present disclosure, and are not intended to limit the present disclosure. Any modification or variation in the form and details of the implementation may be made by those skilled in the art without departing from the spirit and scope of the disclosure. The scope of patent protection of the present disclosure is still subject to the scope defined by the appended claims.

The invention claimed is:

1. A photoelectric detection substrate, comprising:
a thin film transistor; and
a photodiode, which is coplanar with the thin film transistor,
wherein the thin film transistor has a vertical channel structure and comprises a gate electrode, an active layer, a first electrode and a second electrode, and
wherein the photodiode comprises a first doped layer, an absorption layer and a second doped layer,
wherein the absorption layer is between the first doped layer and the second doped layer,
wherein the active layer and the absorption layer are in a first layer and formed by a first patterning process.

2. The photoelectric detection substrate according to claim 1, further comprising:
a base,
wherein the photodiode further comprises a lower electrode under the first doped layer, and the first electrode and the lower electrode are on the base in a second layer and formed by a second patterning process.

3. A photoelectric detection device comprising the photoelectric detection substrate of claim 1.

4. The photoelectric detection substrate according to claim 2,
wherein the thin film transistor further comprises a first contact layer between the base and the active layer for electrically connecting the first electrode, the active layer and the lower electrode.

5. The photoelectric detection substrate according to claim 4, wherein the thin film transistor further comprises a second contact layer between the active layer and the second electrode, and wherein the second contact layer and the second doped layer are in a third layer and formed by a third patterning process.

6. The photoelectric detection substrate according to claim 5, wherein the photodiode further comprises an upper electrode on the second doped layer and an electrode lead connected to the upper electrode, and wherein the electrode lead and the second electrode are in a fourth layer and formed by a fourth patterning process.

7. The photoelectric detection substrate according to claim 6, further comprising:

a first insulating layer between the first electrode and the active layer.

8. The photoelectric detection substrate according to claim 7, further comprising:

a second insulating layer between the gate electrode and the active layer.

9. The photoelectric detection substrate according to claim 8, further comprising:

a third insulating layer between the gate electrode and the second electrode.

10. The photoelectric detection substrate according to claim 9, further comprising:

a fourth insulating layer on the second electrode for planarizing an upper surface of the photoelectric detection substrate.

11. The photoelectric detection substrate according to claim 10, wherein an orthographic projection of the upper electrode on the base is smaller than an orthographic projection of the absorption layer on the base, and wherein the orthographic projection of the upper electrode on the base is within range of the orthographic projection of the absorption layer on the base.

12. A method for fabricating a photoelectric detection substrate comprising a thin film transistor and a photodiode which is coplanar with the thin film transistor, the method comprising:

forming a first contact layer and a first electrode of the thin film transistor and a lower electrode and a first doped layer of the photodiode on a base;

forming an active layer and a second contact layer of the thin film transistor and an absorption layer, a second doped layer and an upper electrode of the photodiode, wherein the active layer and the absorption layer are in a first layer and formed by a first patterning process, and wherein the active layer is connected to the first contact layer through a first via; and forming a gate electrode and a second electrode of the thin film transistor and an electrode lead of the photodiode, wherein the second electrode is connected to the second contact layer through a second via.

13. The method according to claim 12, wherein the first electrode and the lower electrode are in a second layer and formed by a second patterning process.

14. The method according to claim 12, wherein the second contact layer and the second doped layer are in a third layer and formed by a third patterning process.

15. The method according to claim 12, wherein the second electrode and the electrode lead are in a fourth layer and formed by a fourth patterning process.

16. The method according to claim 12, wherein the forming the first contact layer and the first electrode of the thin film transistor and the lower electrode and the first doped layer of the photodiode on the base comprises:

forming a first contact layer on the base;

forming a first electrode and a lower electrode, wherein respective ends of the first electrode and the lower electrode, which are adjacent to each other, are connected to the first contact layer, respectively;

forming a first insulating layer on the first electrode and the lower electrode, with a third via exposing the lower electrode that is formed on the first insulating layer; and forming a first doped layer on the first insulating layer, wherein the first doped layer is connected to the lower electrode through the third via.

17. The method according to claim 12, wherein the forming the active layer and the second contact layer of the thin film transistor and the absorption layer, the second doped layer and the upper electrode of the photodiode comprises:

forming the first via exposing the first contact layer on a first insulating layer; and forming the active layer and the second contact layer of the thin film transistor and the absorption layer, the second doped layer and the upper electrode of the photodiode by the first patterning process, wherein the active layer is connected with the first contact layer through the first via, the second contact layer is on the active layer, the absorption layer is on the first doped layer, the second doped layer is on the absorption layer, and the upper electrode is on the second doped layer.

18. The method according to claim 12, wherein the forming the gate electrode and the second electrode of the thin film transistor and the electrode lead of the photodiode comprises:

depositing an insulating layer film and a metal film in this order, and forming a second insulating layer and a gate electrode, wherein the gate electrode is at sidewalls of the active layer;

forming a third insulating layer on the gate electrode, with a second via exposing the second contact layer and a fourth via exposing the upper electrode being formed on the third insulating layer; and forming a second electrode and an electrode lead on the third insulating layer, wherein the second electrode is connected to the second contact layer through the second via, and the electrode lead is connected to the upper electrode through the fourth via.

19. The method according to claim 17, wherein the forming the active layer and the second contact layer of the thin film transistor and the absorption layer, the second doped layer and the upper electrode of the photodiode by the first patterning process comprises:

depositing an intrinsic layer film, a second doped layer film, and a transparent conductive film, wherein the second doped layer film is between the intrinsic layer film and the transparent conductive film;

patterning the intrinsic layer film, the second doped layer film, and the transparent conductive film to form the active layer and the second contact layer of the thin film transistor, as well as the absorption layer and the second doped layer of the photodiode, wherein the second contact layer and the second doped layer are on the transparent conductive film; and patterning the transparent conductive film on the second contact layer and the second doped layer, and removing the transparent conductive film on the second contact layer, so that the transparent conductive film on the second doped layer is inwardly retracted, and the upper electrode is formed on the second doped layer.

* * * * *